United States Patent

[11] 3,628,166

[72] Inventor Jack R. Harford
Three Bridges, N.J.

[21] Appl. No. 41,755
[22] Filed June 3, 1970
[45] Patented Dec. 14, 1971
[73] Assignee RCA Corporation
Continuation of application Ser. No. 766,905, Oct. 11, 1968. This application June 3, 1970, Ser. No. 41,755

[54] WIDE-BAND AMPLIFIER
16 Claims, 1 Drawing Fig.

[52] U.S. Cl. .......... 330/29, 330/20, 330/145
[51] Int. Cl. .......... H03g 3/30
[50] Field of Search .......... 330/20, 28, 29, 138, 144, 145; 325/319, 410, 413

[56] References Cited

UNITED STATES PATENTS

| | | | |
|---|---|---|---|
| 3,001,145 | 9/1961 | Bradmiller | 330/29 X |
| 3,388,338 | 6/1968 | Austin | 330/29 |
| 3,447,094 | 5/1969 | Beres | 330/29 |
| 3,449,686 | 6/1969 | Bladen | 330/29 |

FOREIGN PATENTS

| | | | |
|---|---|---|---|
| 888,995 | 2/1962 | Great Britain | 330/29 |
| 969,202 | 9/1964 | Great Britain | 330/29 |

*Primary Examiner*—Roy Lake
*Assistant Examiner*—James B. Mullins
*Attorney*—Eugene M. Whitacre ABSTRACT: A wide-band amplifier including a pair of transistors is arranged in a cascode configuration. Input signals are controllably attenuated over a given range of amplitudes by a coupling network to stabilize at a predetermined amplitude those signals applied to the common-emitter transistor of the cascode pair for amplification. Such an arrangement enables the common-base transistor of the transistor pair to develop output signals having significantly less distortion than would be present where input signals of the order of 100 millivolts or so are applied without any attenuation to the common-emitter transistor; it also enables the common-base transistor to maintain an output signal-to-noise ratio substantially greater than would be the case if attenuation were employed throughout.

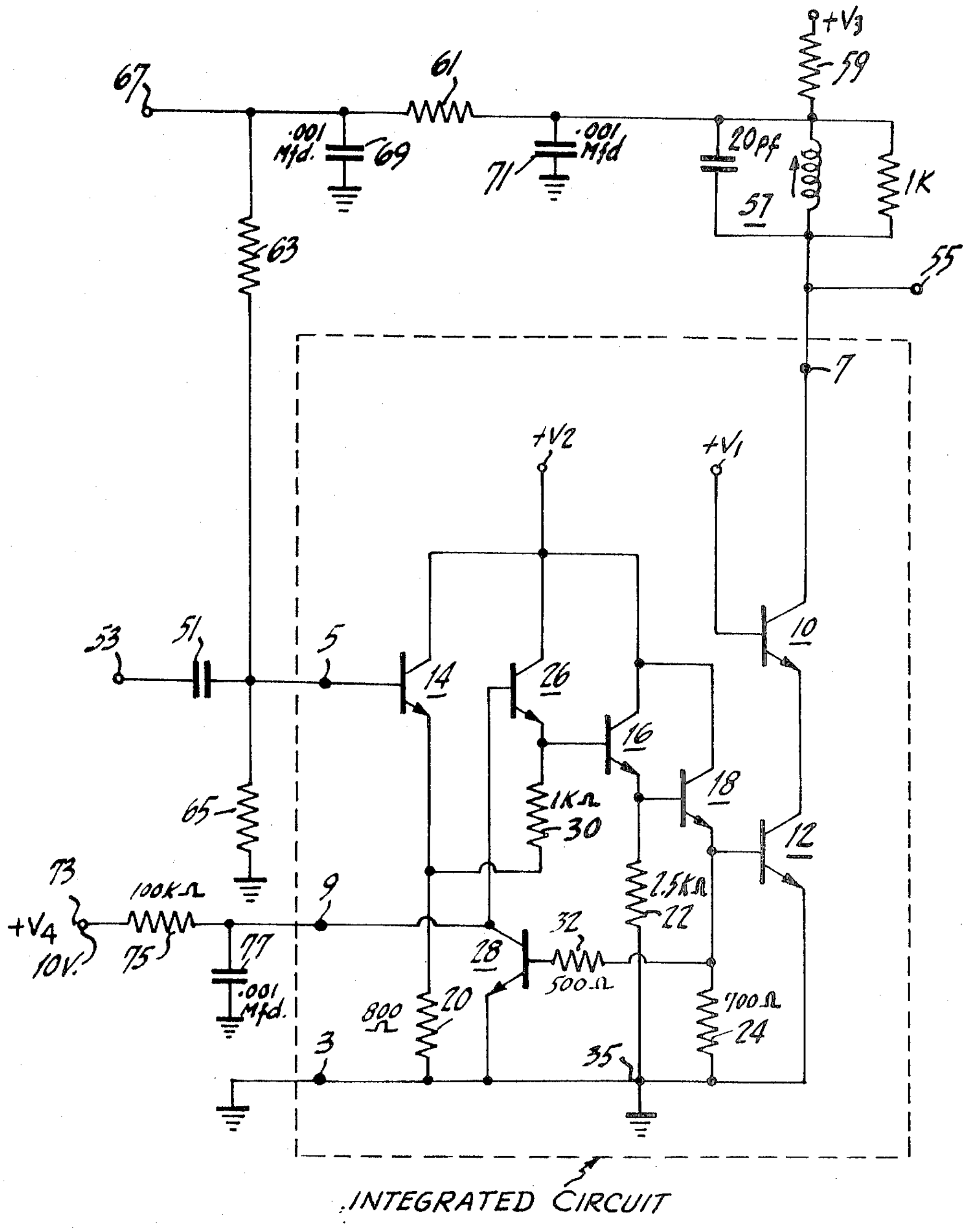
INTEGRATED CIRCUIT
INVENTOR
JACK R. HARFORD
BY Charles Brodsky
ATTORNEY

WIDE-BAND AMPLIFIER

This is a continuation of application Ser. No. 766,905 filed Oct. 11, 1968.

This invention relates to wide-band amplifiers and, more particularly, to one which is especially suited for fabrication using integrated circuit techniques.

In accordance with the invention, a wide-band amplifier includes a pair of transistors arranged in a cascode configuration. Input signals to be amplified are applied to the common-emitter transistor of the cascode pair through a coupling network. For amplitudes below a predetermined level, the input signals are applied to the common-emitter transistor substantially unattenuated, but for amplitudes above that level, the coupling network attenuates the applied signal in a manner so as to stabilize the signal swing across that transistor's input electrodes. Such an arrangement enables the common-base transistor of the cascode pair to develop output signals having significantly less distortion than would be present where input signals of the order of 100 millivolts or so are applied to the common-emitter transistor without any attenuation.

The coupling network employs a normally nonconducting attenuator transistor and a normally saturated attenuation delay transistor. The latter is connected to sense the current flow in the cascode common-emitter transistor and to come out of saturation when the current flow indicates that signals applied to that common-emitter transistor are of the predetermined amplitude. In response thereto, the nonconducting transistor is rendered conductive to provide an attenuation path for the input signals applied to the cascode pair. As the input signal amplitude increases beyond that predetermined level, the nonconducting transistor becomes more conductive, to provide greater attenuation and to thereby effectively stabilize the signal swing across the input electrodes of the common-emitter cascode transistor.

The point at which the normally saturated delay transistor comes out of saturation to initiate the described attenuator action is controlled by a separate current source, e.g., a resistor and direct voltage setting. Thus, by increasing or decreasing either the resistor or the voltage setting, the current source and, consequently, the delay in reaching the attenuation-initiating point, can easily be controlled. Such an arrangement enables the common-base transistor of the cascode pair to maintain an output signal-to-noise ratio substantially greater than would be the case if attenuation were employed throughout; in the latter case, the drive signal to the cascode pair would be attenuated even for small amplitude signals, while the main source of noise—that generated within the common-emitter cascode transistor—would remain unchanged. With the arrangement of the invention, on the other hand, attenuation of the drive signal does not occur until that signal reaches a predetermined appreciable amplitude, i.e., not until the output signal-to-noise ratio reaches an acceptable value.

The above-described wide-band amplifier is especially useful as the gain controlled stage in the intermediate frequency (IF) channel of a transistorized television receiver. There, tuner manufacturing techniques are such that the delivered output signal at minimum signal strength without application of automatic gain control (maximum sensitivity condition) is of the order of tenths of millivolts while the comparable value at maximum signal strength with automatic gain control applied (minimum sensitivity condition) often reaches 100 millivolts. While the smaller of these two values can easily be handled by a conventional cascode transistor pair in the following gain controlled IF stage, the application of the larger of these values to the transistor pair introduces severe distortion in the amplified output. Attenuating the applied signal to the pair to an acceptable value for high input amplitudes reduces this distortion, but similarly attenuating the signals for the low input amplitudes would decrease the signal-to-noise ratio of the developed output as the major source of noise—that of the common-emitter cascode transistor—would remain substantially unchanged. The result of this condition is that while the distortion is decreased, the noise in the reproduced television picture, for example, is increased.

As is apparent, however, these disadvantages are significantly reduced by using the wide-band amplifier of the present invention which, as will be subsequently become clear, operates to continuously attenuate the signals applied to the common-emitter transistor of the cascode pair once the signal amplitude reaches that level at which distortion would otherwise be introduced, and to provide substantially no attenuation to those signal amplitudes which the cascode pair can easily handle and where attenuation would serve to impair signal-to-noise ratio.

For a better understanding of the wide-band amplifier of the present invention, reference is had to the following description taken in connection with the single FIGURE of the drawing showing one of its embodiments, and its scope will be pointed out in the appended claims.

Referring to the drawing, the wide-band amplifier there shown includes a pair of cascode transistors 10 and 12 illustratively incorporated as part of an integrated circuit structure. The emitter electrode of the transistor 10 is connected to the collector electrode of the transistor 12, while the emitter electrode of that latter transistor is connected to a common reference, e.g., ground, point 35 for the integrated circuit structure, provided by way of a contact area 3. The base electrode of the transistor 10 is connected to a source of energizing potential $+V_1$ whereas the corresponding electrode of the transistor 12 is coupled to receive signals for amplification in a manner to be described hereinafter. Input signals to be amplified by the wide-band circuit are applied to the integrated structure by means of a contact area 5, and output signals developed by the circuit are taken from the collector electrode of the transistor 10 at a contact area 7.

The wide-band amplifier also includes three emitter-follower transistors 14, 16 and 18, each having an associated load resistor 20, 22, and 24 respectively. The collector electrodes of these transistors are commonly connected to a source of energizing potential $+V_2$ while their emitter electrodes are commonly coupled to the reference ground point 35 by way of their associated load resistors. The emitter electrode of the transistor 16 is also connected to the base electrode of the transistor 18, the emitter electrode of that transistor is additionally connected to the base electrode of the transistor 12, and the base electrode of the transistor 14 is connected to the input signal contact area 5. The wide-band amplifier of the drawing additionally includes a network for coupling signals between the emitter electrode of the transistor 14 and the base electrode of the transistor 16. More particularly, the network includes a pair of transistors 26 and 28 and a pair of resistors 30 and 32. The collector electrode of the transistor 26 is connected to the $+V_2$ energizing source, while the corresponding electrode of the transistor 28 is connected both to the base electrode of the transistor 26 and to the contact area 9, at which point control currents are applied to the integrated chip for a purpose to be described below/ The resistor 30 is connected between the emitter electrodes of the transistors 14 and 26, and the resistor 32 is connected between the base electrodes of the transistors 12 and 28. Lastly, the emitter electrode of the transistor 26 is connected to the base electrode of the transistor 16 and the emitter electrode of the transistor 28 is connected to the reference point 35.

When employed as the gain controlled first IF amplifier stage in a color television receiver, the input signal contact area 5 is coupled by means of a capacitor 51 to the output of the tuner, represented by the terminal 53. The output signal contact area 7 is coupled to the input of a second IF amplifier stage (the terminal 55) and, also, to a source of operating potential $+V_3$ for the cascode transistors 10 and 12 by means of a resonant circuit 57 tuned to 50 MHz. and a resistor 59. Bias voltages for the transistor 14 are supplied by a divider network including resistors 59, 61, 63 and 65 serially connected in the order named between the source $+V_3$ and ground potential, with the contact area 5 being connected between the junction of resistors 63 and 65. Automatic gain control (AGC) voltage signals supplied from a terminal 67 to the junction of resistors 61 and 63 serve to vary the bias voltage for the transistor 14, and a pair of bypass capacitors 69 and 71 are included at either ends of resistor 61. An additional source of control potential $+V_4$ is coupled via a resistor 75 from a terminal 73 to the contact area 9, with a capacitor 77 added to bypass the contact area 9 to ground. This potential $+V_4$ and resistor 75—both external to the integrated circuit construction—comprise the current source previously mentioned to set the threshold of attenuator action.

In such an environment the amplitude of signals supplied by the tuner characteristically range from a few tenths of a millivolt to 100 millivolts or so. Signals having amplitude values near the upper end of this range overload the cascode amplifier stage 10–12, and are distorted thereby. The wide-band amplifier of the present invention, however, obviates this difficulty.

In the operation of the amplifier and in the absence of supplied signals to the terminal 53, the voltage at the base electrode of transistor 16 with respect to the reference point 35 is approximately 2.1 volts positive—the sum of the base-emitter voltage drops of transistors 12, 16 and 18. The energizing source $+V_4$ and the resistors 32 and 75 are selected so that the resulting current flow through resistor 32 in this quiescent condition places transistor 28 in a saturated state, with its collector electrode voltage in turn rendering transistor 26 nonconducting. As input signals of increasing amplitude are supplied, a level will be reached at which AGC signals will be developed (in any known manner) and applied to the terminal 67 to stabilize the signal excursion at the amplifier output terminal 55. These control signals are translated by the divider network 63, 65, the transistors 14, 16 and 18, and the resistor 30 from the terminal 67 to the transistor 12 to lower the transconductance of that transistor by decreasing (i.e., making more negative) its base electrode bias voltage. At the same time, the supplied input signals will be coupled to the transistor 12 by transistor 14, resistor 30, transistor 16 and transistor 18 in that order. Thereafter, while one result of increasing input signal strength would be to further decrease the gain of the transistor 12 in order to effect the desired output signal stabilization, a second result would be that transistor 28 would remain in saturation until the translated gain control signals caused a predetermined bias voltage to be reached at the transistor 12. Once that level is reached, however, the following will be seen to happen.

First, the transistor 28 will come out of saturation, increasing its collector electrode output voltage and the base electrode bias voltage of transistor 26. When the increase is such as to render transistor 26 conducting, the reduction in impedance level to ground through the voltage supply $+V_2$ that would result at that transistor's emitter electrode would serve to attenuate slightly—due to voltage divider action in conjunction with the resistor 30—the signal applied to transistor 16 and, consequently, the signal applied to the base electrode of transistor 12. (In this respect, it will be understood that the emitter follower transistors 16 and 18 operate to increase the impedance presented to the signals translated from transistor 14 by resistor 30. The resistor 30 is selected to be small enough compared to the effective input impedance between the base electrode of transistor 16 and ground so that there will be little attenuation of the AGC voltage when transistor 26 is nonconducting.) Second, the increase in voltage at the collector electrode of transistor 28 serves to lower the impedance of the transistor 26 so that the total AGC voltage is divided down in a manner to stabilize the direct voltage at the base of transistor 12 at a relatively fixed value.

As the supplied input signal continues to increase in amplitude, the supplied AGC signal continues to increase (more negative) as well. The negative feedback loop including transistor 16, 18, 26, and 28 and resistor 32 serves, however, to stabilize the direct voltage at the base electrode of transistor 26 and, consequently, serves to oppose any change that AGC signal increase would otherwise tend to cause in the transistor 12 base electrode bias. This situation of maintaining constant the bias on transistor 12 prevails after the input signal amplitude and AGC voltage increases sufficiently to bring the transistor 28 out of saturation.

As the supplied input signal continues to increase in amplitude, at the same time, the increasing AGC voltage coupled to transistor 14 causes the voltage at that transistor's emitter electrode to become less positive. This, in turn, causes an increase in current flow through resistor 30—rendering transistor 26 more conductive—and causes a corresponding decrease in impedance at the emitter electrode of transistor 26. The signal developed at the emitter electrode of transistor 14 is thereby attenuated prior to its translation to the base electrode of transistor 16 by an amount equal to that reduced impedance to the resistance of resistor 30, with the amount of attenuation being directly proportional to the then amplitude of the supplied input signal. The result is to effectively stabilize the signal excursions at the base electrodes of the transistors 16 and 18 and, more importantly, at the base electrode of the transistor 12.

Once an input signal amplitude is reached at which transistor 28 comes out of saturation, therefore, it will be seen that the control over the signal amplitude developed at output terminal 55 will be governed by the operation of the attenuator transistor 26 in conjunction with the resistor 30. Stated another way, for a first amplitude range of supplied input signals, control is effected in the described amplifier by virtue of the supplied AGC signals reducing the gain of the transistor 12 stage while, beyond that range, the control is provided by attenuator action reducing the amplitude of signals applied to transistor 12 for amplification. As will be readily apparent, the demarcation from the first type of control to the second type is primarily and precisely established by the selection of the energizing source $+V_4$ and the resistor 75, which together determine, or "delay," the threshold point at which transistor 28 will come out of saturation. As will also be apparent, the emitter follower transistor 14 serves to isolate the resulting impedance changes due to the attenuator action from the signal supply circuitry connected to the input terminal 53.

This operation is particularly useful in the intermediate frequency amplifier of a television receiver. There, input signals having amplitudes ranging from approximately tenths of millivolts to 100 millivolts are supplied by the tuner. To prevent distortion from being introduced in the output signal of a cascode amplifier (such as includes transistors 10 and 12), it has been found that the maximum signal swing at the base electrode of the common emitter transistor of the pair e.g., transistor 12) should be of the order of 10 millivolts. Using the amplifier of the invention, it is but a simple matter to delay the attenuator action until the amplitude of signal applied to transistor 12 reaches this 10 millivolt level, by the selection of potential for the source $+V_4$ and resistance for the resistor 75. For increases of corresponding input signal amplitude such as would exceed this 10 millivolt translated level, the attenuator would effectively maintain the amplitude of applied signal to the transistor 12, and would prevent the introduction of distortion into the developed output. For corresponding input signals below this amplitude level, no attenuation would be provided, and no deterioration in output signal-to-noise ratio would result.

I claim:

1. A wide-band amplifier comprising:

a first transistor having a signal input electrode and a signal output electrode coupled to a signal output terminal of the amplifier;

a source of automatic gain control signals;

a source of input signals to be amplified;

first means for coupling said input signal and automatic gain control signal sources to said input electrode, said means comprising a voltage divider including a substantially fixed resistance and the emitter-collector conduction path of a second transistor for coupling said input signals to said input electrode substantially without attenuation over a first range of input signal amplitudes and further coupling said input signals to said input electrode with controlled attenuation for input signal amplitudes beyond said range to effectively limit signal excursions at said input electrode to a level corresponding to the upper end of said first signal amplitude range; and second means coupled between said first and second transistors for sensing presence of input signal amplitude beyond said range and for transferring said first means to controlled attenuation operation.

2. A wide-band amplifier as defined in claim 1 wherein said second means comprises negative feedback means for stabilizing the bias voltage at said input electrode for input signal amplitudes beyond said range.

3. A wide-band amplifier as defined in claim 2 wherein said first means is arranged for coupling said automatic gain control signals to said input electrode over said first range of signal amplitudes, and said first and second means stabilize said bias voltage and the amplitude of signal applied to said input electrode for signal amplitudes beyond said range.

4. A wide-band amplifier comprising:

a first transistor having signal input and signal output terminals;

a second transistor coupled to sense the current flow in said first transistor and biased into saturation for applied signals having a first range of amplitude excursions;

a third transistor having an input electrode coupled to an output electrode of said second transistor and biased into nonconduction when said second transistor is in saturation;

a source of input signals to be amplified;

and means for coupling said source to said input of said first transistor, said means including an impedance coupling said signals to said first transistor substantially without attenuation over said first range of signal amplitude excursions and forming an attenuator network with said third transistor for signal amplitudes beyond said range effective in bringing said second transistor out of saturation and rendering said third transistor conducting.

5. A wide-band amplifier as defined in claim 4 wherein there is also included a source of automatic gain control signals and means, including said source automatic means, for coupling said control signals to said input of said first transistor to vary the direct voltage bias level thereat over said first range of signal amplitudes and to stabilize said direct voltage bias level for signal amplitudes beyond said range.

6. A wide-band amplifier as defined in claim 5 wherein said signal source coupling means additionally includes a fourth transistor arranged in an emitter follower configuration interposed between said signal source and said attenuator impedance.

7. A wide-band amplifier as defined in claim 5 wherein said signal source coupling means additionally includes a fourth transistor arranged in an emitter follower configuration interposed between said attenuator impedance and the input electrode of said first transistor.

8. A wide-band amplifier as defined in claim 5 wherein said signal source coupling means includes a negative feedback loop including said second and third transistors coupled between said input of said first transistor and said source of gain control signals.

9. A wide-band amplifier comprising:

a pair of transistors arranged in cascode configuration having a signal input electrode and a signal output terminal;

a source of input signals to be amplified;

a source of automatic gain control signals;

and means including an attenuator network coupling said input and gain control signals to said cascode configuration input electrode, said attenuator network substantially inoperative over a first range of input signal amplitudes wherein the amplitude of signals developed at said output terminal is primarily governed by said gain control signals, and said attenuator network being substantially operative beyond said range wherein the amplitude of signals developed at said output terminal is primarily governed by the attenuation of said input signals by said network.

10. A wide-band amplifier comprising:

a pair of transistors arranged in cascode configuration having a signal input electrode and a signal output terminal;

a source of input signal to be amplified;

a source of automatic gain control signals;

first means coupling said source of input signals to said second input electrode;

second means coupling said source of gain control signals to said input electrode;

an attenuator network coupled to said first means;

a signal threshold detector coupled between said signal input electrode and said attenuator network;

and means for setting the threshold of signal detection for causing said attenuator network to be substantially inoperative over a first range of input signal amplitudes, wherein the amplitude of signals developed at said output terminal is primarily governed by said automatic gain control signals, and for causing said attenuator network to be substantially operative beyond said range, wherein the amplitude of signals developed at said output terminal is primarily governed by the resulting attenuation of said input signals.

11. A wide-band amplifier as defined in claim 10 wherein said cascode connected transistors, said first and second means, said attenuator network, and said signal threshold detector are included in a negative feedback loop to stabilize the bias voltage at said signal input electrode for input signal amplitudes beyond said first range.

12. A wide-band amplifier as defined in claim 1 wherein a third transistor is included to couple said signal output electrode to said amplifier output terminal in a manner to form a cascode configuration with said first transistor.

13. A wide-band amplifier comprising a first transistor having a signal input electrode and a signal output electrode;

a source of automatic gain control signals;

a source of input signals to be amplified;

first means for coupling said input signal ans automatic gain control signal sources to said input electrode over at least a first range of input signal levels;

second means for sensing input signal amplitude beyond said first range and for stabilizing the bias voltage at said input electrode and the gain of said first transistor in response to sensing of said amplitude; and third means coupling said second means to said first means for varying the level of signals supplied to said input electrode in response to said sensing of said amplitude.

14. A wide-band amplifier according to claim 13 wherein said second means comprises negative feedback means coupled to said input electrode for maintaining said bias voltage and said gain of said first transistor substantially fixed for input signals beyond said first range.

15. A wide-band amplifier according to claim 14 wherein said first means comprises a variable divider network including a substantially fixed impedance and a variable impedance transistor for coupling said input signals to said input electrode substantially without attenuation over at least said first range of amplitudes and further coupling said input signals to said input electrode with controlled attenuation for input signal amplitudes beyond said range to limit signal excursions at said input electrode to a level corresponding substantially to the upper end of said first signal amplitude range.

16. A wide-band amplifier according to claim 15 wherein said second means is further coupled to said variable impedance transistor for transferring said first means to controlled attenuator operation while stabilizing said bias voltage for input signals beyond said range.

* * * * *